(12) United States Patent
Chuang

(10) Patent No.: US 12,512,426 B2
(45) Date of Patent: Dec. 30, 2025

(54) PACKAGE STRUCTURE AND METHOD FOR FORMING SAME

(71) Applicant: CHANGXIN MEMORY TECHNOLOGIES, INC., Hefei (CN)

(72) Inventor: Ling-Yi Chuang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 793 days.

(21) Appl. No.: 17/656,104

(22) Filed: Mar. 23, 2022

(65) Prior Publication Data

US 2023/0230945 A1    Jul. 20, 2023

(30) Foreign Application Priority Data

Jan. 20, 2022    (CN) .................... 202210066315.0

(51) Int. Cl.
*H01L 23/00*    (2006.01)
*H01L 25/10*    (2006.01)

(52) U.S. Cl.
CPC .............. *H01L 24/08* (2013.01); *H01L 24/03* (2013.01); *H01L 24/04* (2013.01); *H01L 24/05* (2013.01); *H01L 24/06* (2013.01); *H01L 24/09* (2013.01); *H01L 24/16* (2013.01); *H01L 24/80* (2013.01); *H01L 25/105* (2013.01); *H01L 24/13* (2013.01); *H01L 2224/0345* (2013.01); *H01L 2224/03452* (2013.01); *H01L 2224/03614* (2013.01); *H01L 2224/05541* (2013.01); *H01L 2224/05557* (2013.01); *H01L 2224/05688* (2013.01); *H01L 2224/0603* (2013.01); *H01L 2224/06051* (2013.01); *H01L 2224/06505* (2013.01); *H01L 2224/08148* (2013.01);

(Continued)

(58) Field of Classification Search
CPC ..... H01L 25/0657; H01L 24/83; H01L 24/04; H01L 2224/0603; H01L 2224/06102; H01L 2224/06051; H01L 2224/08148
See application file for complete search history.

(56) References Cited

U.S. PATENT DOCUMENTS 11,348,901 B1 *   5/2022   Hou .................. H01L 24/32
11,911,839 B2 *   2/2024   Shah ................. H01L 24/80
(Continued)

FOREIGN PATENT DOCUMENTS

CN    101295691 A    10/2008
CN    103107146 A    5/2013
(Continued)

OTHER PUBLICATIONS

CN first office action in application No. 202210066315.0, mailed on Oct. 28, 2024.
(Continued)

*Primary Examiner* — Mary A Wilczewski
(74) *Attorney, Agent, or Firm* — Syncoda LLC; Feng Ma

(57) ABSTRACT

A package structure includes the following: a logic die; and a plurality of core dies sequentially stacked on the logic die along a vertical direction, in which the plurality of core dies include a first core die and a second core die interconnected through a hybrid bonding member; the hybrid bonding member includes: a first contact pad located on a surface of the first core die; and a second contact pad located on a surface of the second core die; the first contact pad is in contact bonding with the second contact pad.

5 Claims, 17 Drawing Sheets

(52) U.S. Cl.
CPC ............... *H01L 2224/09505* (2013.01); *H01L 2224/13147* (2013.01); *H01L 2224/16146* (2013.01); *H01L 2224/80097* (2013.01); *H01L 2224/80895* (2013.01); *H01L 2224/80896* (2013.01); *H01L 2224/80948* (2013.01); *H01L 2225/1058* (2013.01); *H01L 2924/1431* (2013.01); *H01L 2924/1436* (2013.01)

(56) References Cited

U.S. PATENT DOCUMENTS

| | | | |
|---|---|---|---|
| 12,218,102 B2* | 2/2025 | Jee | H01L 25/0657 |
| 2017/0250162 A1* | 8/2017 | Soga | H01L 24/27 |
| 2019/0259743 A1* | 8/2019 | Han | H01L 25/0657 |
| 2021/0280544 A1* | 9/2021 | Chen | H01L 24/08 |
| 2022/0173071 A1* | 6/2022 | Hou | H01L 24/73 |
| 2022/0199559 A1* | 6/2022 | Fang | H01L 24/09 |
| 2023/0074933 A1* | 3/2023 | Jee | H01L 24/80 |
| 2023/0139612 A1* | 5/2023 | Kim | H01L 24/14 257/621 |
| 2023/0201952 A1* | 6/2023 | Shah | H01L 24/05 228/3.1 |
| 2023/0230945 A1* | 7/2023 | Chuang | H01L 24/09 |
| 2023/0352317 A1* | 11/2023 | Chuang | H01L 24/80 |
| 2024/0339423 A1* | 10/2024 | Chuang | H01L 24/06 |
| 2025/0006674 A1* | 1/2025 | Uzoh | H01L 24/05 |
| 2025/0008750 A1* | 1/2025 | Zhou | H01L 24/16 |

FOREIGN PATENT DOCUMENTS

| | | |
|---|---|---|
| CN | 109964313 A | 7/2019 |
| CN | 112236849 A | 1/2021 |
| CN | 113013151 A | 6/2021 |

OTHER PUBLICATIONS

CN first office action in application No. 202411198012.X, mailed on Aug. 12, 2025.

* cited by examiner

PACKAGE STRUCTURE AND METHOD FOR FORMING SAME

CROSS-REFERENCE TO RELATED APPLICATION

The present application claims priority to Chinese Patent Application No. 202210066315.0 filed on Jan. 20, 2022, the disclosure of which is hereby incorporated by reference in its entirety.

BACKGROUND

As people's requirements for electronic products are developing towards miniaturization and multifunctionality, packaging is also developing towards high density and high integration, and integrated circuit products are also developing from 2D to 3D. 3D packaging is a promising way to meet these requirements, and has the advantages of reducing the packaging volume and increasing the circuit reliability, thereby realizing the integration of one system or a certain function on a 3D structure. Therefore, it is very meaningful to develop a new packaging process to realize the overall packaging of dies with different functions, so as to reduce the overall size of the die packaging, which is also a technical problem that needs to be solved urgently at present.

SUMMARY

The disclosure relates to the technical field of semiconductors, and in particular, to a package structure and a method for forming same.

Embodiments of the disclosure provide a package structure, the package structure includes a logic die; and a plurality of core dies sequentially stacked on the logic die along a vertical direction; in which the plurality of core dies include a first core die and a second core die interconnected through a hybrid bonding member; the hybrid bonding member includes: a first contact pad located on a surface of the first core die; a second contact pad located on a surface of the second core die; a first dielectric layer located on a periphery of the first contact pad; and a second dielectric layer located on a periphery of the second contact pad; in which the first contact pad is in contact bonding with the second contact pad; and the first dielectric layer is in contact bonding with the second dielectric layer.

Embodiments of the disclosure further provide a method for forming a package structure, and the method includes: providing a logic die, a first core die, and a second core die; respectively arranging a first contact pad and a second contact pad on a surface of the first core die and a surface of the second core die, a first dielectric layer located on a periphery of the first contact pad, and a second dielectric layer located on a periphery of the second contact pad; sequentially stacking the first core die and the second core die on the logic die, so that the first contact pad and the second contact pad are butted; and performing a bonding process, to form a hybrid bonding member by allowing the first contact pad and bonded to each other, and the first dielectric layer and the second dielectric layer bonded to each other.

BRIEF DESCRIPTION OF THE DRAWINGS

In order to more clearly illustrate the embodiments of the present disclosure or technical solutions in the conventional technology, the drawings required for describing the embodiments are briefly introduced. It is apparent that the drawings in the following description show only some embodiments of the disclosure, and a person of ordinary skill in the art may still derive other drawings from these drawings without creative efforts.

DETAILED DESCRIPTION

Figure 1A:
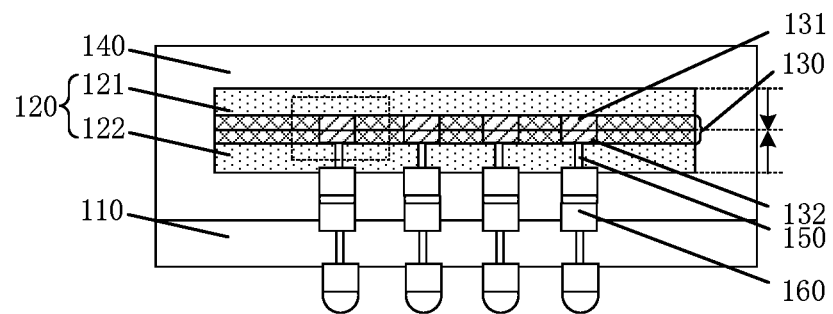
FIG. 1A is a schematic cross-sectional view of a package structure in an embodiment of the disclosure.

With reference to the accompanying drawings, exemplary embodiments disclosed in the disclosure will be described below in detail Although the accompanying drawings illustrate the exemplary implementations of the disclosure, it should be understood that the disclosure may be implemented in various forms, and should not be limited by the particular embodiments described here. On the contrary, the purpose of providing these embodiments to more thoroughly understand the disclosure, and to convey the scope of the disclosure fully to those skilled in the art.

In the accompanying drawings, for clarity, the sizes of layers, areas, elements and their relative sizes may be exaggerated. The same reference numerals refer to the same elements throughout.

It should be understood that when an element or a layer is referred to as being "on", "adjacent to", "connected to" or "coupled to" another element or layer, it may be directly on, adjacent to, connected to or coupled to the other element or layer, or an intervening element or layer may be present. In contrast, when an element is referred to as being "directly on", "directly adjacent to", "directly connected to" or "directly coupled to" another element or layer, there is no intervening element or layer. It should be understood that though the terms first, second, third, etc., are used to describe the elements, components, areas, layers and/or parts, those elements, components, areas, layers and/or parts should not be limited by the terms. The terms are merely used to distinguish one element, component, area, layer or part to another element, component, area, layer or part. Thus, a first element, component, area, layer or part, which is discussed below, may be referred to as a second element, component, area, layer or part, without departing from the scope of the disclosure. Moreover, when a second element, component, area, layer or part is discussed, it does not mean that a first element, component, area, layer or second is necessarily present in the disclosure.

Spatially relative terms, such as "under", "below", "lower", "beneath", "above", "upper", etc., are used herein for ease of description to describe the relationship between one element or feature and another element or feature as illustrated in the drawings. It should be understood that the spatially relative terms are intended to encompass different orientations of a device in use or operation, in addition to the orientation depicted in the drawings. For example, if the device in the drawings is turned over, an element or feature described as "below" or "beneath" or "under" another element would then be oriented "above" relative to another element or feature. Thus, the exemplary terms "below" and "under" can encompass two orientations of above and below. The device may be otherwise oriented (rotated 90 degrees or at other orientations) and the spatially relative descriptors used herein are interpreted accordingly.

The terms used herein is for the purpose of describing particular embodiments only and is not intended to limit the disclosure. As used herein, the singular forms "a", "an" and "the" are intended to include the plural forms as well, unless the context clearly indicates otherwise. It should be further understood that the terms "comprise" and/or "include", when used in this description, specify the presence of stated features, integers, steps, operations, elements, and/or components, but it do not preclude the presence or addition of one or more other features, integers, steps, operations, elements, components, and/or groups thereof. As used herein, the term "and/or" includes anyone and all combinations of the associated listed items.

The performance of the current package structure still has disadvantages, and how to optimize the performance of the package structure is a technical problem that needs to be solved urgently at this stage.

Metal micro-bump technology is a process used in early 3D stacking, and is mainly used in package stacking and low-density die stacking. This technology uses the signal and power transmission between an active surface and a non-active surface of a die, that is, in the vertical direction of a Through-Silicon Via (TSV), and that the signal is then transmitted to the next layer through metal micro-bumps to realize the 3D interconnection between layers. In this technology, filling materials need to be poured into gaps between the layers. If the metal micro-bumps are used to realize 3D stacking, the following problems may be caused: the parasitic capacitance and inductance of the metal micro-bumps are large, which limits the signal transmission speed; the thermal conductivity of the filling materials is far lower than that of silicon, which limits the heat transfer from the inside of the die to the outside, causing the serious heat-dissipation problem; the pitch of the metal micro-bumps is usually greater than 30 micrometers, and it is easy to cause the problems such as bridging and pseudo soldering after the density is increased, which cannot meet the requirements of high-density 3D interconnection.

Therefore, embodiments of the disclosure provide a package structure. As shown in FIG. 1A and FIG. 2A, FIG. 2A is a schematic enlargement view of a hybrid bonding member in the dashed box of FIG. 1A in an embodiment of the disclosure. The package structure includes: a logic die 110; and a plurality of core dies 120 sequentially stacked on the logic die 110 along a vertical direction. The plurality of core dies 120 include a first core die 121 and a second core die 122 interconnected through a hybrid bonding member 130. The hybrid bonding member 130 includes: a first contact pad 131 located on a surface of the first core die; a second contact pad 132 located on a surface of the second core die; a first dielectric layer 135 located on a periphery of the first contact pad; and a second dielectric layer 136 located on a periphery of the second contact pad. The first contact pad 131 is in contact bonding with the second contact pad 132. The first dielectric layer 135 is in contact bonding with the second dielectric layer 136. The vertically stacked core dies 120 can be interconnected through a plurality of vias 150, e.g. TSVs. The logic die 110 is interconnected to the core dies 120 adjacent to the logic die through copper pillar bumps 160. The material of the first contact pad 131 or the second contact pad 132 includes but is not limited to an alloy formed from one or more of copper, gold, silver, aluminum, nickel, tungsten, titanium, tin, conductive graphene or carbon nanotubes. The material of the first dielectric layer 135 or the second dielectric layer 136 includes but is not limited to silicon oxide, spin on glass, silicon nitride, silicon oxynitride, silicon carbonitride, aluminum oxide, amorphous silicon, silicon carbide, or aluminum nitride. In a specific embodiment, the material of the first dielectric layer 135 or the second dielectric layer 136 is spin on glass. The spin on glass has good filling capability and good compatibility with the core dies. In other embodiments, as shown in FIG. 1b, the first core die 121 or the second core die 122 is interconnected to other core dies 120 through copper pillar bumps 160.

The logic die 110 may be configured to communicate with a plurality of core dies 120, so as to access data from the core dies 120 and store data in one or more processors of the plurality of core dies 120. The logic die 110 includes but is not limited to a Graphics Processing Unit (GPU), a Field Programmable Gate Array (FPGA), an Application Specific Integrated Circuit (ASIC), a Central Processing Unit (CPU) or other known electronic circuits used as processors. The core dies include Dynamic Random Access Memory (DRAM) memory dies.

Figure 1B:
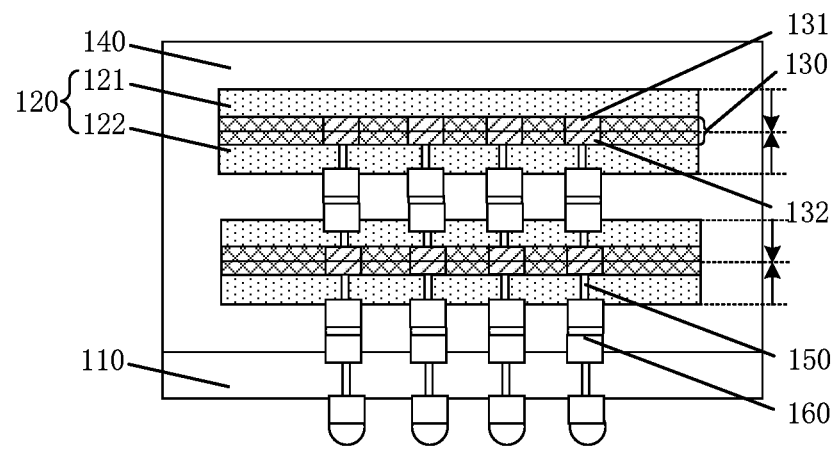
FIG. 1B is a schematic cross-sectional view of a package structure in another embodiment of the disclosure.
Figure 2A:
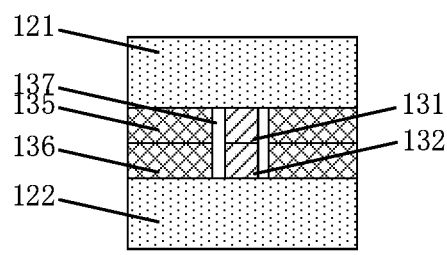
FIG. 2A is a schematic view of a hybrid bonding member in the dashed box of FIG. 1a in an embodiment of the disclosure.

Although FIG. 1A and FIG. 1B respectively show only two and four core dies, any other number of core dies may be included in other embodiments, e.g. 8, 16, 32, and 64 core dies.

Conventional multiple core dies are usually interconnected using metal micro-bumps. The metal micro-bumps have high signal delay and large parasitic capacitance. Pseudo soldering easily occurs to interconnected metal micro-bumps to cause an open circuit, and bridging easily occurs to adjacent metal micro-bumps. Insulating materials need to be filled between adjacent metal micro-bumps.

Insulating materials having low thermal conductivity limit heat-dissipation of a package structure. In the present disclosure, a hybrid bonding process is used between multiple core dies to realize hybrid bonding stacking and thus reduce the number of micro-bumps of a package structure, increasing the signal transmission speed of the package structure, and decreasing the thermal resistance of the package structure.

In some embodiments, the package structure further includes: a package compound 140 located above the logic die 110 and covering the plurality of core dies 120. The material of the package compound 140 may be, for example, an epoxy resin, a phenol formaldehyde resin, polyimide, silica gel or spin on glass, etc. The package compound can protect the package structure from the external dust, moisture, and mechanical shock, thereby improving the reliability of the package structure.

In some embodiments, as shown in FIG. 2A, FIG. 2A is a schematic enlargement view of a hybrid bonding member in the dashed box of FIG. 1A in an embodiment of the disclosure. The package structure further includes: a first via and a second via respectively located in the first dielectric layer 135 and the second dielectric layer 136. The first contact pad 131 and the second contact pad 132 are respectively formed in the first via and the second via. There is a gap area 137 between a side wall of the first contact pad and a side wall of the first via; and/or there is a gap area 137 between a side wall of the second contact pad and a side wall of the second via. By designing the contact pads of upper and lower core dies, a gap is reserved between the contact pad and the dielectric layer to reduce the strong binding of the dielectric layer to the contact pad, so that there is sufficient deformation space during bonding of the first contact pad to the second contact pad, bonding defects are reduced or avoided, the occurrence of dielectric separation is prevented, and the yield is improved. At the same time, since the sufficient deformation space is transversely reserved, the metal reserve margin of the contact pad may be longitudinally set, for example, a top surface of the contact pad is designed to be higher than a surface of the dielectric layer, so that the first contact pad is in full contact with the second contact pad, and bonding defects (a gap or void between metals) are avoided, thereby realizing hybrid bonding under low temperature condition. In some embodiments, a width of a top of the gap area 137 is greater than a width of a bottom of the gap area 137 (not shown in the drawing). The top of the gap area 137 refers to an end portion of the gap area 137 distant from a core die, and the bottom of the gap area 137 refers to an end portion of the gap area 137 close to the core die. Bonding defects can be further reduced by setting above different widths.

In some embodiments, Young's moduli of the first dielectric layer 135 and the second dielectric layer 136 are less than Young's modulus of the package compound 140. Exemplarily, the material of the first dielectric layer 135 or the second dielectric layer 136 may be spin on glass (SOG). Since the spin on glass has relatively small Young's modulus and good ductility, the package stress can be reduced.

Figure 2B:
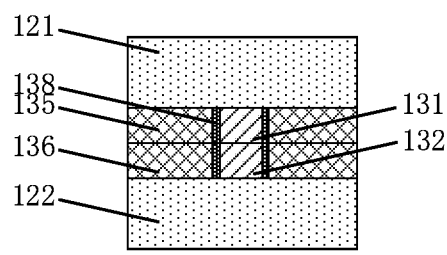
FIG. 2B is a schematic enlargement view of a hybrid bonding member in the dashed box of FIG. 1A in another embodiment of the disclosure.

In some embodiments, as shown in FIG. 2B, the gap area 137 is filled with an insulating material 138. The Young's modulus of the insulating material 138 is less than those of the first dielectric layer 135 and the second dielectric layer 136. In an actual operation, the insulating material may be an organic polymer, e.g. a synthetic rubber, a synthetic fiber, polyethylene, and polyvinyl chloride, and may be also spin on glass. As the gap area has a poor thermal conductivity and easily causes die fatigue, by setting an insulating material having good ductility as a cushion layer in the gap area a contact pad occurs deformation after metal bonding, and attached to an insulating layer and dielectric layer, which can reduce the gap and improve the bonding quality. In some embodiments, an insulating material 138 may include two parts, such as a lower insulating material and an upper insulating material, and the Young's modulus of the lower insulating material is less than that of the upper insulating material. The lower insulating material is closer to the first core die 121 or the second core die 122 than the upper insulating material. By setting the Young's modulus of the lower insulating material to be less than that of the upper insulating material, the deformation caused by metal bonding can be further buffered, the gap is reduced, and the bonding quality is improved.

In some embodiments, materials of the first contact pad and the second contact pad are different. In the traditional technology, the materials for metal bonding are usually the same, but when the bonding temperature is relatively low, or there is a recess on the metal surface, the insufficient metal expansion of the contact pad leads to the existence of the gap between the metals, which in turn leads to the bonding defects. By arranging contact pads of different materials and utilizing the difference in the coefficient of thermal expansion of different materials, the degree of expansion of the contact pads during bonding can be flexibly and accurately controlled, improving the controllability of the bonding process and reducing the formed gap.

In some embodiments, as shown in FIG. 1A and FIG. 1B, the first contact pad 131 is formed on an active surface of the first core die 121. The second contact pad 132 is formed on an active surface of the second core die 122. The active surface of the first core die 121 is bonded to the active surface of the second core die 122. The active surface is a side of the core die 120 where a device layer (not shown in the drawings) is formed. For the convenience of understanding, the arrow in the drawing indicates that a non-active surface of the core die 120 points to an active surface of the core die 120. The non-active surface is an opposite side of the active surface. By bonding active surfaces of a plurality of core dies, the distance between the device layers of the core dies is lower, and the transmission path of signals between the core dies is shortened, and thus the transmission speed is improved. In an actual operation, a first core die 121 and a second core die 122 are first subjected to hybrid bonding, and then core dies 120, after hybrid bonding, are bonded to a logic die 110. In the process, the active surface of the first core die 121 is bonded to the active surface of the second core die 122. Due to the symmetric structure, the stress is distributed more uniformly, and thus the bonding quality is improved.

Figure 3A:
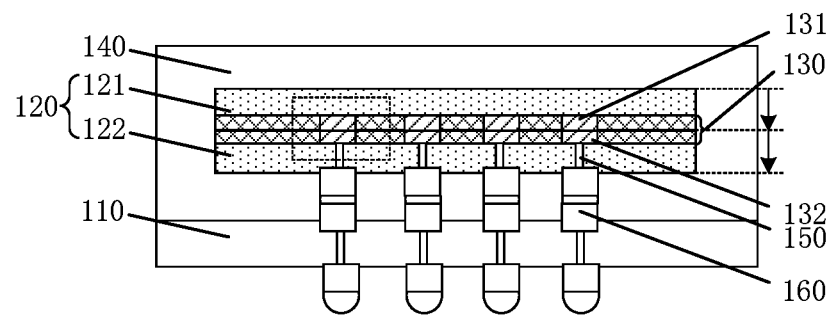
FIG. 3A is a schematic cross-sectional view of a package structure in another embodiment of the disclosure.
Figure 3B:
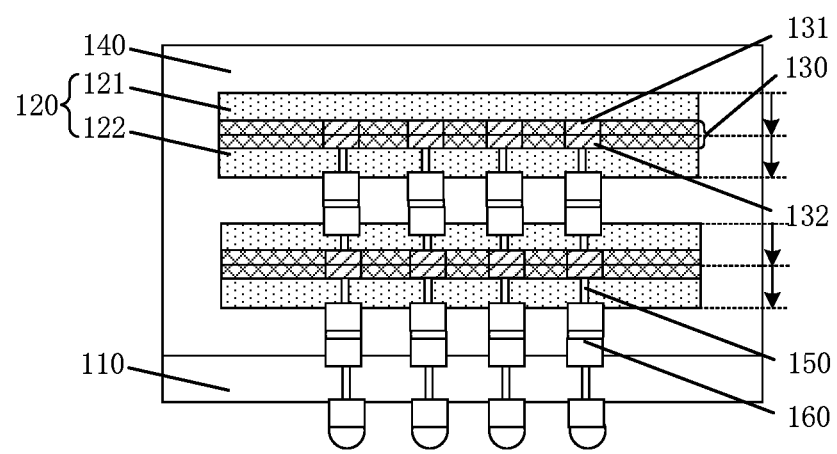
FIG. 3B is a schematic cross-sectional view of a package structure in another embodiment of the disclosure.

In some embodiments, as shown in FIG. 3A and FIG. 3B, the first contact pad 131 is formed on the active surface of the first core die 121. The second contact pad 132 is formed on the non-active surface of the second core die 122. The active surface of the first core die 121 is bonded to the non-active surface of the second core die 122. The active surface is a side of the core die 120 where a device layer (not shown in the drawings) is formed. The non-active surface is an opposite side of the active surface. In this package structure, all the active surfaces of the core dies 120 face towards the same side. Compared with the approach of bonding active surfaces of a plurality of core dies, this solution does not require to additionally turn over the core dies, which simplifies the mounting process of the core dies.

Figure 4A:
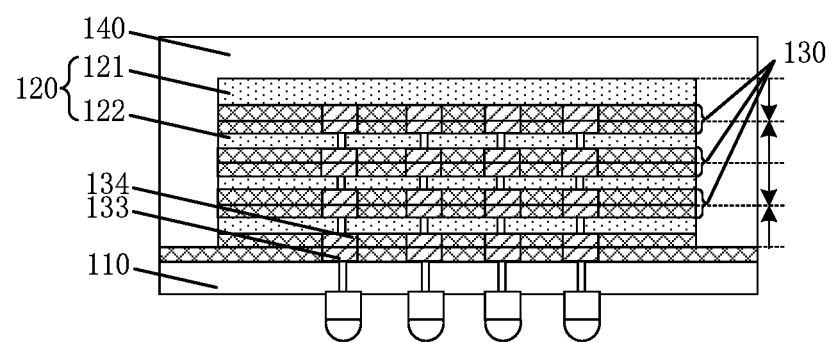
FIG. 4A is a schematic cross-sectional view of a package structure in another embodiment of the disclosure.
Figure 4B:
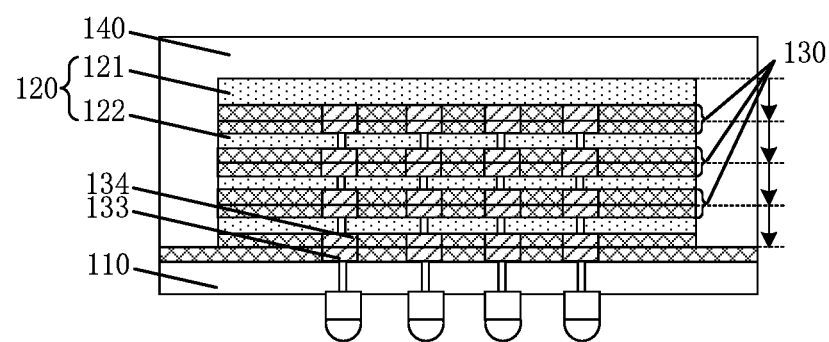
FIG. 4B is a schematic cross-sectional view of a package structure in another embodiment of the disclosure.

In some embodiments, as shown in FIG. 4A and FIG. 4B, adjacent core dies 120 are interconnected through the hybrid bonding members 130. In the solutions described in FIG. 1B and FIG. 3B, core dies, after hybrid bonding, are interconnected to adjacent core dies through copper pillar bumps. Compared with metal micro-bumps, the copper pillar bumps have advantages such as improvement of the integration and low resistance, but the bonding performance of the copper pillar bumps still cannot meet the requirements of an application end. In this embodiment, adjacent core dies 120 are interconnected through hybrid bonding, which can further reduce the number of metal micro-bumps in a stacking structure, and improve the signal transmission speed between the core dies in the stacking structure.

In some embodiments, as shown in FIG. 4A and FIG. 4B, the logic die 110 is interconnected to a core die 120 adjacent to the logic die through a first bonding member. The first bonding member includes: a third contact pad 133 located on a surface of the logic die; and a fourth contact pad 134 located on a surface of the core die adjacent to the logic die. The third contact pad 133 is in contact bonding with the fourth contact pad 134. In some other embodiments, the first bonding member further includes: a third dielectric layer (not numbered in the drawings) located on a periphery of the third contact pad and a fourth dielectric layer (not numbered in the drawings) located on a periphery of the fourth contact pad. The third dielectric layer is in contact bonding with the fourth dielectric layer. The core die and the logic die are interconnected through hybrid bonding, which can further reduce the number of micro-bumps in a package structure, improve the signal transmission speed between the core die and the logic die, and reduce the thermal resistance of the package structure.

Figure 5:
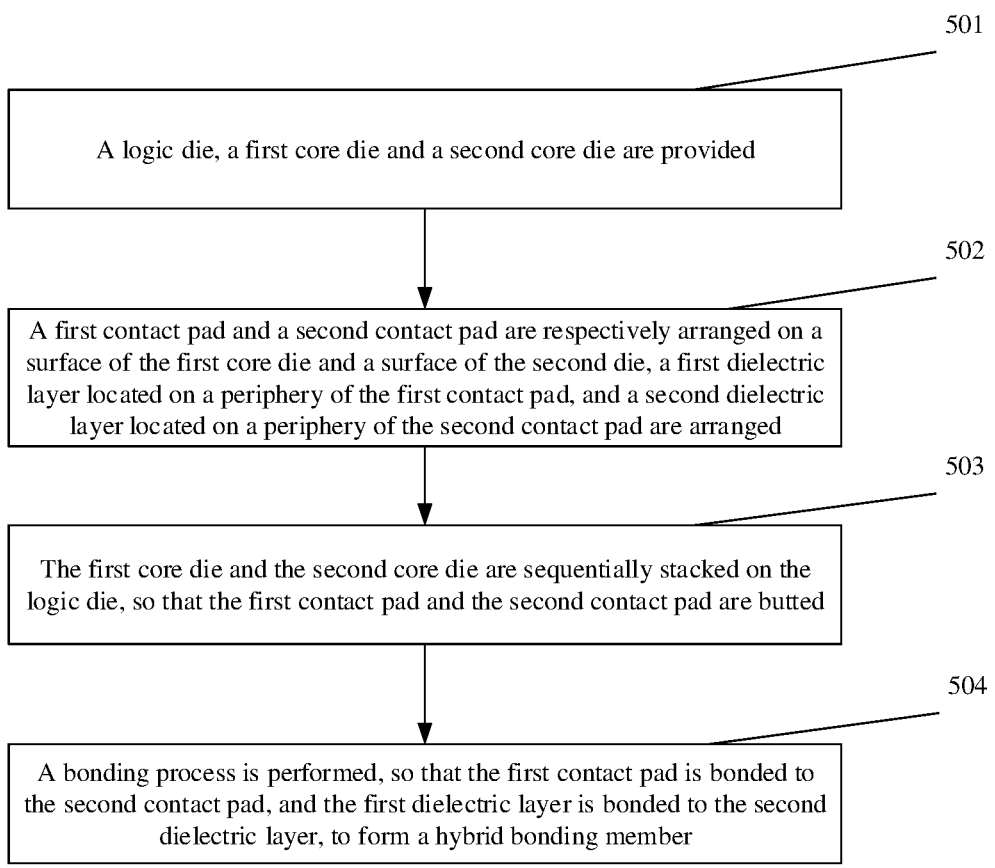
FIG. 5 is a flowchart of a method for forming a package structure in an embodiment of the disclosure.

The disclosure further provides a method for forming a package structure. With reference to FIG. 5, the method includes the following operations.

At operation 501, a logic die, a first core die, and a second core die are provided.

At operation 502, a first contact pad and a second contact pad are respectively arranged on a surface of the first core die and a surface of the second core die, a first dielectric layer located on a periphery of the first contact pad, and a second dielectric layer located on a periphery of the second contact pad are arranged.

At operation 503, the first core die and the second core die are sequentially stacked on the logic die, so that the first contact pad and the second contact pad are butted.

At step 504, a bonding process is performed, so that the first contact pad is bonded to the second contact pad, and the first dielectric layer is bonded to the second dielectric layer, to form a hybrid bonding member.

The method for forming a package structure provided in an embodiment of the disclosure will be described in detail below with reference to FIGS. 6A to 6H.

Figure 6A:
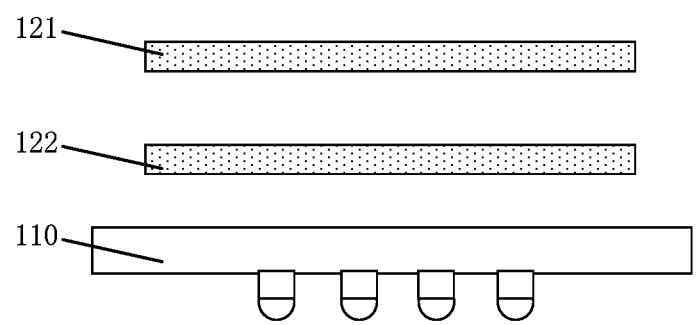
FIG. 6A is a first schematic structural view of a package structure in the forming process in an embodiment of the disclosure.

First, as shown in FIG. 6a, the operation 501 is executed, namely, a logic die 110, a first core die 121 and a second core die 122 are provided. The logic die 110 includes but is not limited to a GPU, an FPGA, an ASIC, a CPU or other known electronic circuits used as processors. The first core die 121 or the second core die 122 includes a DRAM memory die.

Figure 6B:
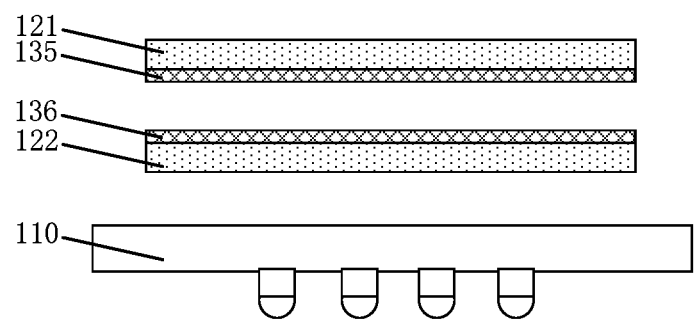
FIG. 6B is a second schematic structural view of a package structure in the forming process in an embodiment of the disclosure.
Figure 6C:
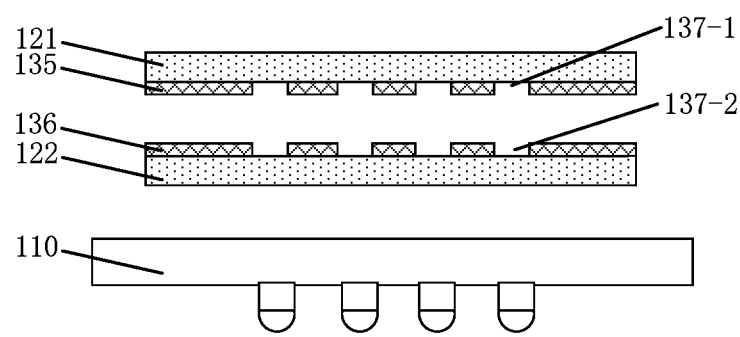
FIG. 6C is a third schematic structural view of a package structure in the forming process in an embodiment of the disclosure.
Figure 6D:
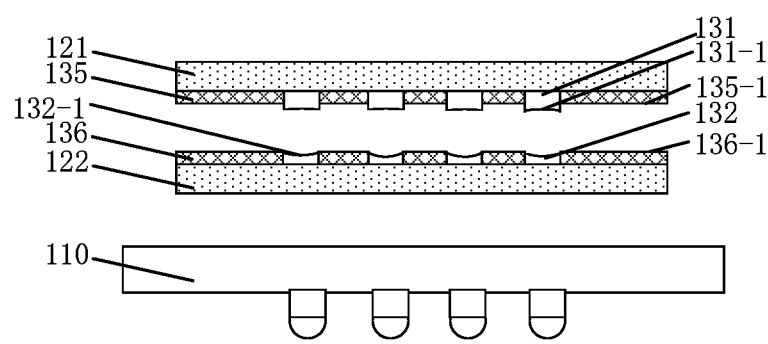
FIG. 6D is a fourth schematic structural view of a package structure in the forming process in an embodiment of the disclosure.

Then, as shown in FIGS. 6B to 6D, the operation 502 is executed, namely, respectively arranging a first contact pad 131 and a second contact pad 132 on surfaces of the first core die 121 and the second core die 122, a first dielectric layer 135 located on a periphery of the first contact pad, and a second dielectric layer 136 located on a periphery of the second contact pad. The material of the first contact pad 131 or the second contact pad 132 includes but is not limited to an alloy formed from one or more of copper, gold, silver, aluminum, nickel, tungsten, titanium, tin, conductive graphene or carbon nanotubes.

Specifically, firstly, as shown in FIG. 6B, the first dielectric layer 135 and the second dielectric layer 136 are respectively formed on the first core die 121 and the second core die 122. Here, the formation process of the first dielectric layer 135 and the second dielectric layer 136 includes but is not limited to a Chemical Vapor Deposition (CVD) process, a Plasma-Enhanced Chemical Vapor Deposition (PECVD) process, an Atomic Layer Deposition (ALD) process or a combination thereof. The material of the first dielectric layer 135 or the second dielectric layer 136 includes but is not limited to silicon oxide, silicon nitride, silicon oxynitride, silicon carbonitride, aluminum oxide, amorphous silicon, silicon carbide, or aluminum nitride.

Next, as shown in FIG. 6C, the first dielectric layer 135 and the second dielectric layer 136 are etched to respectively form a first via 137-1 and a second via 137-2. Here, the size and shape of the vias can be set according to requirements. The etching process includes wet etching or dry etching, e.g. High-Density Plasma (HDP) etching or Reactive-Ion Etching (ME).

Next, as shown in FIG. 6D, the first contact pad 131 and the second contact pad 132 are respectively formed in the first via 137-1 and the second via 137-2. The formation process of the first contact pad 131 and the second contact pad 132 may be, for example, Physical Vapor Deposition (PVD) or CVD. In an actual operation, a first contact pad material layer and a second contact pad material layer are respectively deposited above the first dielectric layer and the second dielectric layer, and a planarization process is respectively performed on the first contact pad material layer and the second contact pad material layer to form the first contact pad and the second contact pad. The planarization process may be, for example, Chemical Mechanical Polishing (CMP).

In an embodiment, a top surface 131-1 of the first contact pad is higher than a surface 135-1 of the first dielectric layer. A top surface 132-1 of the second contact pad is lower than a surface 136-1 of the second dielectric layer. When the planarization process is performed, the polishing rates of the dielectric layer and the contact pad are different, which usually causes a recess on the metal surface, even easily causes local overpolishing, and generates the serious disk-shaped defect. At this time, when a bonding process is performed, dielectric layers contact with each other, while metals do not contact with each other or there is a contact gap between metals due to the recess. If the bonding temperature is not high enough, the insufficient expansion of the metals leads to the existence of the gap between the metals, which in turn leads to the bonding defect. In this solution, contact pads are designed so that the top surface of one of the contact pads is higher than the surface of the dielectric layer and the metal reserve margin of the contact pad can ensure that the contact pads are in full contact during bonding, and thus the bonding quality is improved. In an actual operation, the first contact pad material layer is deposited above the first dielectric layer. The first contact pad material layer covering the surface of the first dielectric layer is etched through a mask, and the contact pad material layer in the first via is reserved, so that the top surface 131-1 of the first contact pad is higher than the surface 135-1 of the first dielectric layer. In other embodiments, after the first contact pad is formed by performing the planarization process, the first dielectric layer is etched, so that the top surface 131-1 of the first contact pad is higher than the surface 135-1 of the first dielectric layer. The top surface 132-1 of the second contact pad is lower than the surface 136-1 of the second dielectric layer, which may be due to the disk-shaped defect caused by the planarization process or be formed by etching the second contact pad.

Figure 6E:
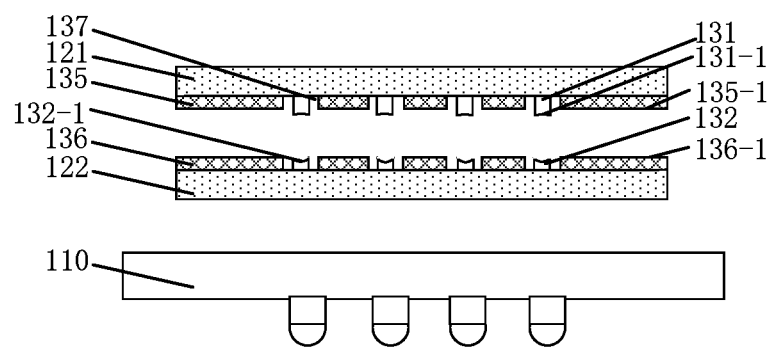
FIG. 6E is a fifth schematic structural view of a package structure in the forming process in an embodiment of the disclosure.

In an embodiment, as shown in FIG. 6E, after the first contact pad 131 and the second contact pad 132 are respectively formed in the first via 137-1 and the second via 137-2, the method further includes: the first contact pad is etched, so that the gap area 137 is formed between the side wall of the first contact pad and the side wall of the first via; and/or the second contact pad is etched, so that the gap area 137 is formed between the side wall of the second contact pad and the side wall of the second via. By reserving the gap between the contact pad and the dielectric layer, the strong binding of the dielectric layer to the contact pad is reduced, so that there is sufficient deformation space during bonding of the first contact pad to the second contact pad, bonding defects are reduced or avoided, the occurrence of dielectric separation is prevented, and the yield is improved. In other embodiments, a part of the first dielectric layer is etched, so that the gap area is formed between the first contact pad and the first dielectric layer; and/or a part of the second dielectric layer is etched, so that the gap area is formed between the second contact pad and the second dielectric layer.

Figure 6F:
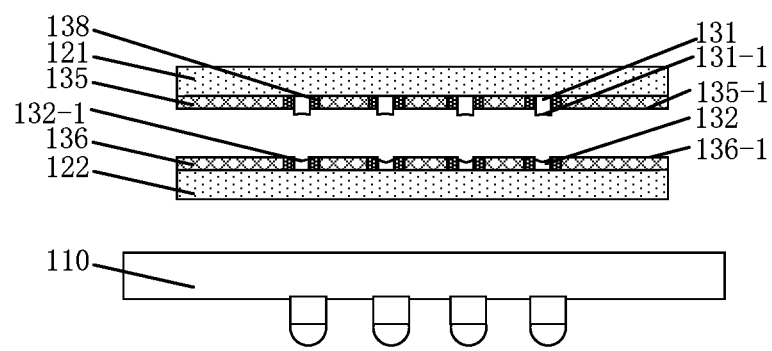
FIG. 6F is a sixth schematic structural view of a package structure in the forming process in an embodiment of the disclosure.

In an embodiment, as shown in FIG. 6F, after the gap area 137 is formed, the method further includes that an insulating material 138 is deposited. The gap area 137 is filled with the insulating material 138. The Young's modulus of the insulating material 138 is less than those of the first dielectric layer 135 and the second dielectric layer 136. In an actual operation, the insulating material may be an organic polymer, e.g. a synthetic rubber, a synthetic fiber, polyethylene, and polyvinyl chloride. As the gap area has the poor thermal conductivity and easily causes die fatigue, the insulating material having good ductility is arranged in the gap area as a cushion layer, so that the contact pad deforms after metal bonding and attached to an insulating layer and dielectric layer, which can reduce the gap and improve the bonding quality.

Figure 6G:
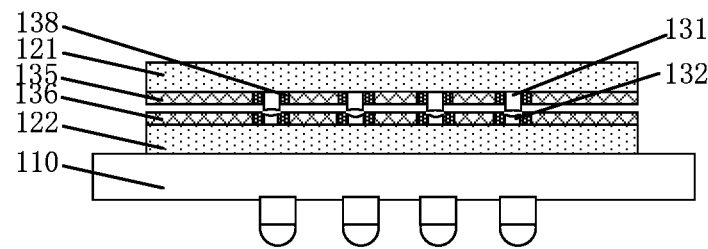
FIG. 6G is a seventh schematic structural view of a package structure in the forming process in an embodiment of the disclosure.

Next, as shown in FIG. 6G, the operation 503 is executed, namely, the first core die 121 and the second core die 122 are sequentially stacked on the logic die 110, so that the first contact pad 131 and the second contact pad 132 are butted. It should be noted that the logic die and the core die adjacent to the logic die can be interconnected through copper pillar bumps (not shown in the drawing). In other embodiments, the logic die and the core die adjacent to the logic die can be interconnected through hybrid bonding members. Optionally, before butting the first contact pad 131 and the second contact pad 132, the surface activation treatment may be performed on the first core die 121 or the second core die 122, the method for treatment includes a plasma surface treatment, an ion membrane or an atomic surface treatment, etc., and surface particles and oxide layers are removed to ensure the bonding interface performance.

Figure 6H:
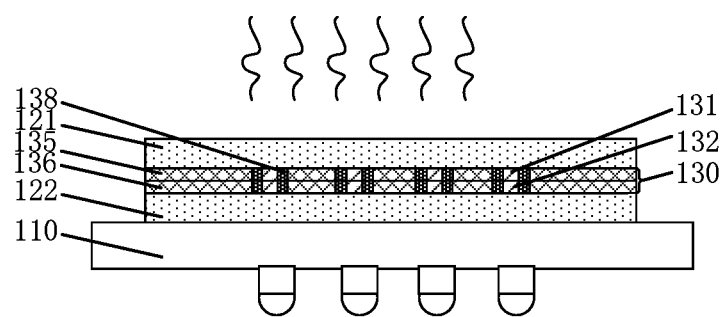
FIG. 6H is an eighth schematic structural view of a package structure in the forming process in an embodiment of the disclosure.

Finally, as shown in FIG. 6H, the operation 504 is executed, namely, the bonding process is performed, so that the first contact pad 131 is bonded to the second contact pad 132, and the first dielectric layer 135 is bonded to the second dielectric layer 136, to form the hybrid bonding member 130. The bonding temperature and pressure are determined according to the materials of the dielectric layer and the contact pad. There is a correspondence between the corresponding pressure and the required temperature, which is consistent with the correspondence between the normal bonding temperature and pressure, and is not described in details here.

In some embodiments, the bonding temperature of the bonding process is less than 200 degrees Celsius. By designing contact pads of upper and lower core dies to make the contact pad of one of upper and lower core dies is higher than the dielectric layer, the metal reserve margin of the contact pad can ensure that the contact pads are in full contact during bonding. There is no need to apply high temperature to expand the metal of the contact pad, and bonding at low temperature can be realized, so that the thermal damage of a package structure is small, and the thermal budget is reduced.

In some embodiments, an alternate annealing process is used for the bonding process. The alternate annealing process refers to the annealing manner in which the annealing temperature is alternately changed, for example, annealing is performed alternately at two temperatures of 150 degrees Celsius and 180 degrees Celsius. By performing alternate multiple annealing, multiple melting bonding can reduce the internal gap (the gap or void between metals), and the internal uniformity of the hybrid bonding member is improved. In another embodiment, the alternate annealing process includes a first temperature and a second temperature. The first temperature is less than 200 degrees Celsius, and the second temperature is greater than 200 degrees Celsius. For example, annealing is performed alternately at the first temperature of 100° C., 125° C., 150° C. or 175° C., and the second temperature of 225° C., 250° C., 275° C., 300° C., 400° C., 500° C. or 600° C. At a low temperature, the thermal damage of a package structure is small, and the thermal budget is reduced, but metals of bonded contact pads may be insufficiently expanded, and there is bonding defects. At a high temperature, contact pads during bonding are in full contact, but the thermal damage may be caused. By using the alternate annealing process at high and low temperatures, the bonding quality can be effectively improved while the thermal damage is reduced.

In conclusion, in the disclosure, the hybrid bonding process is used between a plurality of core dies to realize hybrid bonding stacking, and thus the number of microbumps of the package structure is reduced, increasing the signal transmission speed of the package structure, decreasing the thermal resistance of the package structure, and improving the integration of the package structure.

It should be noted that the package structure and the method for forming same provided in the embodiments of the disclosure can be applied in any integrated circuit including the structure, including but not limited to integrated circuits vertically integrated processed, and thus can be applied to 3D SOC, micro-pad package, low cost and high performance replacement flip die bonding, wafer level package, thermal management, and unique device structures (e.g. metal substrate devices). The application further includes but is not limited to integrated circuits (such as a back-illuminated image sensor), RF front ends, Micro-electro mechanical Structures (MEMSs) (including but not limited to the pico-projector and gyroscope), 3D-stacked memory (including but not limited to hybrid memory block), high bandwidth memory, DIRAM, 2.5D (including but not limited to FPGAs tilted on interposers), and products (including but not limited to mobile phones and other mobile devices, laptop computers, and servers) in which these circuits are used.

The technical features in the technical solutions described in the embodiments may be combined with each other in the case of no conflict. Those skilled in the art can change the order of the operations of the above method for forming without departing from the scope of protection of the disclosure. The various operations in embodiments of the disclosure may be executed simultaneously, or may be executed in a different order as long as there is no conflict.

The foregoing descriptions are merely preferred embodiments of the disclosure, and are not intended to limit the scope of protection of the disclosure. Any modification, equivalent replacement, improvement and the like made within the spirit and principle of the disclosure shall fall within the scope of protection of the disclosure.

What is claimed is:

1. A method for forming a package structure, comprising:
   providing a logic die, a first core die and a second core die;
   respectively arranging a first contact pad and a second contact pad on a surface of the first core die and a surface of the second core die, a first dielectric layer located on a periphery of the first contact pad, and a second dielectric layer located on a periphery of the second contact pad, which further comprises:
   respectively forming the first dielectric layer and the second dielectric layer on the first core die and the second core die;
   etching the first dielectric layer and the second dielectric layer to respectively form a first via and a second via; and
   respectively forming the first contact pad and the second contact pad in the first via and the second via, wherein a top surface of the first contact pad is higher than a surface of the first dielectric layer, and a top surface of the second contact pad is lower than a surface of the second dielectric layer;
   sequentially stacking the first core die and the second core die on the logic die, to allow the first contact pad and the second contact pad butted; and
   performing a bonding process, to form a hybrid bonding member by allowing the first contact pad and the second contact pad to bond to each other, and the first dielectric layer and the second dielectric layer to bond to each other.

2. The method of claim 1, wherein after the first contact pad and the second contact pad are respectively formed in the first via and the second via, the method further comprises:
   etching the first contact pad to form a gap area between a side wall of the first contact pad and a side wall of the first via; and/or
   etching the second contact pad to from a gap area between a side wall of the second contact pad and a side wall of the second via.

3. The method of claim 2, wherein after the gap area is formed, the method further comprises:
   depositing an insulating material, wherein the insulating material is filled in the gap area; a Young's modulus of the insulating material is less than Young's moduli of the first dielectric layer and the second dielectric layer.

4. The method of claim 1, wherein
   a bonding temperature of the bonding process is less than 200 degrees Celsius.

5. The method of claim 1, wherein
   the bonding process adopts an annealing process being performed alternately at two temperatures.

* * * * *